United States Patent
Barsun et al.

(10) Patent No.: US 7,277,292 B2
(45) Date of Patent: Oct. 2, 2007

(54) EXPANDABLE BRACING APPARATUS AND METHOD

(75) Inventors: Stephan Karl Barsun, Sacramento, CA (US); Bryan Bolich, Davis, CA (US); Richard A. Miner, Elverta, CA (US); Michael Wortman, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 148 days.

(21) Appl. No.: 10/834,517

(22) Filed: Apr. 28, 2004

(65) Prior Publication Data

US 2005/0243524 A1 Nov. 3, 2005

(51) Int. Cl.
*H05K 7/20* (2006.01)
*F16B 13/04* (2006.01)
*H01L 23/34* (2006.01)

(52) U.S. Cl. ............... 361/719; 361/704; 361/709; 361/710; 411/34; 257/718; 257/719; 257/727

(58) Field of Classification Search ............... 361/719, 361/704, 709, 710; 257/727, 718–719; 411/38, 411/34
See application file for complete search history.

(56) References Cited

U.S. PATENT DOCUMENTS

| 4,491,447 | A | * | 1/1985 | Smith et al. | 411/15 |
| 4,789,285 | A | * | 12/1988 | Fischer | 411/32 |
| 5,452,975 | A | * | 9/1995 | Grant | 411/22 |
| 6,046,905 | A | * | 4/2000 | Nelson et al. | 361/704 |
| 6,609,866 | B2 | * | 8/2003 | Huang et al. | 411/34 |
| 6,639,800 | B1 | * | 10/2003 | Eyman et al. | 361/704 |
| 6,859,367 | B2 | * | 2/2005 | Davison | 361/704 |
| 2003/0053881 | A1 | * | 3/2003 | Huang et al. | 411/34 |

* cited by examiner

*Primary Examiner*—Jayprakash Gandhi
*Assistant Examiner*—Zachary M Pape

(57) ABSTRACT

A bracing apparatus is disclosed that has a component located within an opening in a cantilevered end of a heatsink. The component has a form factor that is expandable for stabilizing the heatsink at a given elevation relative to a printed circuit board. The bracing apparatus includes a tensioning device located within an opening in the component. When deployed, the tensioning device causes the component to expand. Also included in the bracing apparatus is a coupling medium for coupling the component to the printed circuit board.

21 Claims, 8 Drawing Sheets

EXPANDABLE BRACING APPARATUS AND METHOD

TECHNICAL FIELD

Embodiments of the present invention relate to the field of retainers. More specifically, embodiments of the present invention relate to a retention device for anchoring a heatsink to a printed circuit board.

BACKGROUND

Electronic components are typically mounted on printed circuit boards (PCBs). In order to cool components, such as, for example, processors, integrated circuits, e.g., application specific integrated circuits (ASICs), potentiometers, etc., a heatsink is often mounted proximate to the component. The heatsink typically has a large mass relative to the component it cools. The force necessary to retain this large mass under shock and vibration tends to approach the limit of the load that the component can endure. It is very difficult to hard-mount the heat sink to a PCB without damaging the component. In addition to the force needed to provide the electrical interface between the component and the PCB and the thermal interface between the heatsink and the component, there may also be forces caused by shock and vibration that must be withstood.

Referring to Prior Art FIG. 1, a cantilevered heatsink 110 is shown, having a cantilevered end 195. Heatsink 110 is mounted above a component 115, e.g., a processor, a power pod 140 and a thermal interface 150 and resides within a heatsink frame 120. A retention frame 130 provides a surface for attaching heatsink 110 to a printed circuit board (PCB) 190 with mounting screws 180. Not shown is a socket that serves to provide an electrical interconnect between PCB 190 and processor 115. Processor 115 is mounted to a substrate 170. The socket, substrate 170, processor 115 and thermal interface 150 comprise the stackup upon which heatsink 110 resides.

Each component in the stackup has design tolerances that allow for small variations in thickness (e.g., ±0.4 mm). Depending on the design tolerances of the components within the stackup, the thickness of the stackup may vary by as much as 0.5-2 mm. When heatsink 110 is placed over the stackup, a gap 160 may exist between heatsink 110 and retention frame 130, e.g., due to variances in the thicknesses of components in the stackup. The system is designed to have a gap 160 to ensure that all force is driven through processor 115 uniformly. Heatsink 110 is then secured to retention frame 130 by tightening mounting screws 180. Where gap 160 exists, in order to overcome forces that are applied during vibration (for example, during shipping and handling or during shock or shock testing) by cantilevered end 195, an amount of force may be provided by mounting screws 180, in attempting to close gap 160, that can potentially damage processor 115. The processor 115 might be instantly broken from too much force being applied by mounting screws 180, or a latent failure (small defect) may be introduced that causes breakage after a series of thermal cycles, for example.

One conventional art approach includes using shoulder screws and springs to control the load. However, in instances in which the heatsink is cantilevered away from where the socket is located (e.g., the mass is not centered over the socket), or where the component and/or heatsink is especially heavy, the amount of force needed to hold the component in place can exceed the capability of springs. In such a case, shock or vibration loading may decouple the electrical interface between the processor and the PCB. Additionally, it is very difficult to control the cantilevered mass without driving very non-uniform pressure distributions to the processor.

Another conventional art approach includes the use of wedge-lock hardware at the cantilevered end of the heatsink. This hardware comprises a number of finely machined small pieces that can be expensive and/or difficult to manufacture. In addition, the installation requires aligning a number of small loose components which can render production difficult and time consuming.

SUMMARY

An expandable bracing apparatus and method is disclosed. Embodiments of the present invention include a bracing apparatus that has a component located within an opening in a cantilevered end of a heatsink. The component has a form factor that is expandable for stabilizing the heatsink at a given elevation relative to a printed circuit board. The bracing apparatus includes a compression device located within an opening in the component. When deployed, the compression device causes the component to expand, fixing the cantilevered end in space relative to the printed circuit board. Also included in the bracing apparatus is a coupling medium for coupling the component to the printed circuit board.

BRIEF DESCRIPTION OF THE DRAWINGS

Prior Art

DETAILED DESCRIPTION

Reference will now be made in detail to embodiments of the invention, examples of which are illustrated in the accompanying drawings. While the invention will be described in conjunction with the embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of embodiments of the present invention, numerous specific details are set forth in order to provide a thorough understanding of the present invention. In other instances, well known methods, procedures, and components have not been described in detail so as not to unnecessarily obscure aspects of the present invention. A device and method for anchoring a cantilevered end of a heatsink to a printed circuit board (PCB) is described herein.

Several issues may be considered when mounting a heatsink proximate to a component to be cooled on a PCB. There is a need to provide sufficient force on the component to effect a secure electrical connection with a socket in the PCB, a need to provide sufficient force to maintain an adequate thermal interface between the component to be cooled and the heatsink and a need to provide a force to ensure there is no separation from the electrical connection or the thermal interface during shipping, handling, shock testing, etc. Embodiments of the present invention provide the force to ensure there is no separation from the electrical connection or the thermal interface during shipping, handling, shock testing, etc. Thereby, embodiments of the present invention decouple the need to provide thermal and socket interface load from the need to provide package integrity.

Embodiments of the present invention include a bracing apparatus that has a component located within an opening in a cantilevered end of a heatsink. The component has a form factor that is expandable for stabilizing the heatsink at a given elevation relative to a printed circuit board. The cantilevered end of the heatsink is mounted proximate to the printed circuit board. The bracing apparatus includes a compressioning device located within an opening in the component. When deployed, the compressioning device causes the component to expand. Also included in the bracing apparatus is a coupling medium for coupling the component to the printed circuit board.

Figure 7:
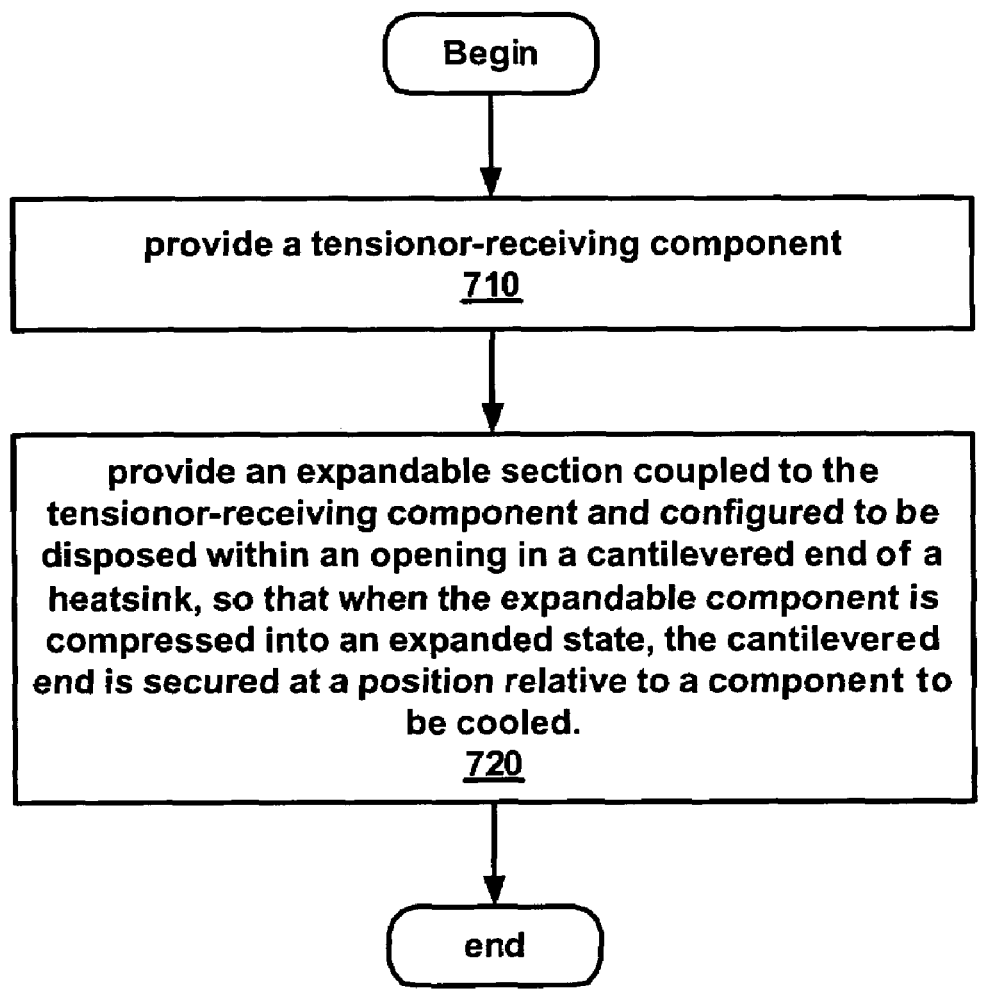
FIG. 7 is a flowchart of a method for enabling the securing of a cantilevered end of a heatsink at a given position relative to a device to be cooled, according to an embodiment of the present invention.

Certain portions of the detailed descriptions of embodiments of the invention, which follow, are presented in terms of processes and methods (e.g., process 700 of FIG. 7). Although specific steps are disclosed herein describing the operations of these processes and methods, such steps are exemplary. That is, embodiments of the present invention are well suited to performing various other steps or variations of the steps recited in the flowchart of the figure herein.

Figure 1:
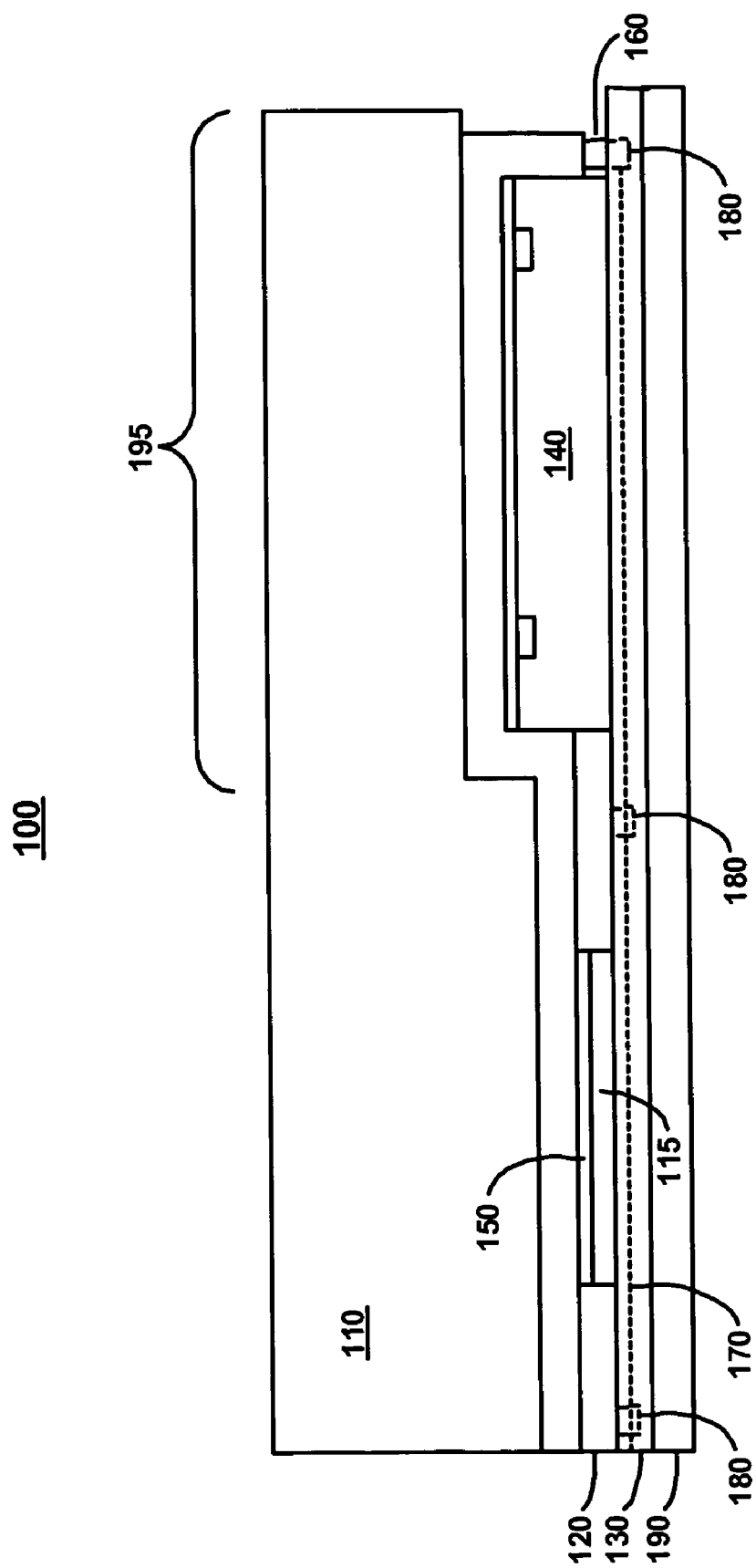
FIG. 1 depicts a heatsink mounted to a printed circuit board using conventional mounting screws.
Figure 2A:
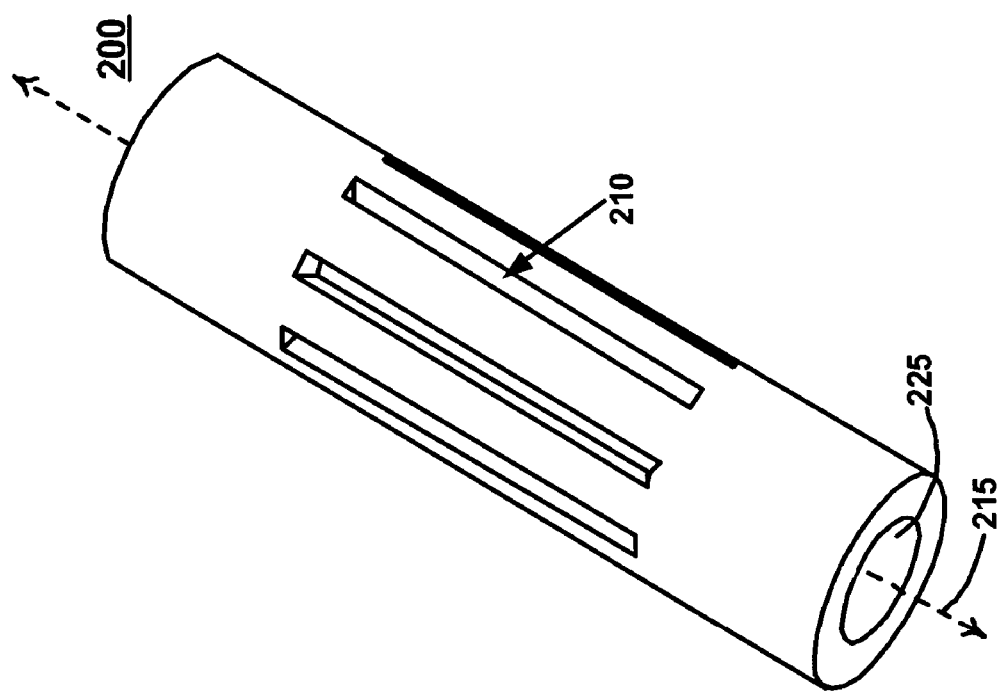
FIG. 2A is a diagram illustrating an expandable plug in a relaxed state, according to an embodiment of the present invention.

Referring now to FIG. 2A, a diagram illustrating an expandable plug 200 in a relaxed state is described, according to an embodiment of the present invention. In one embodiment, expandable plug 200 may be substantially cylindrical. In another embodiment, expandable plug may be a rectangular column. In yet another embodiment, expandable plug 200 may be an octagonal column. In one embodiment, expandable plug 200 may be spherical. Although specific geometries are mentioned above, expandable plug 200 may be of any geometry having a size and form factor to fit in an opening in the cantilevered end of a heatsink and having an opening 225 extending along and through a central axis 215.

Expandable plug 200 has a flat section 230 at each end. Flat surface 230 along with opening 225 provide a component for receiving a compressionor. For the purposes of the present application, the combination of flat surface 230 along with opening 225 is referred to herein as a compressionor-receiving component 225 and 230. Compressionor-receiving component 225 and 230 is adapted to receive a compressionor, e.g., a screw or a cam. That is, when the compressionor is inserted, it is received in the opening 225 and also at the flat section 230. Although flat end 230 of the compressionor-receiving component 225 and 230 is shown to be flush with the ends of expandable plug 200, it should be understood that flat end 230 may also reside in a recess in either one or both ends of expandable plug 200.

Elongated openings 210 in the sides of expandable plug 200 allow the sides to expand outward when tension is applied by a compressionor at compressionor-receiving component 225 and 230, compressing expandable plug 200 along its central axis 215. In one embodiment the elongated openings 210 may be rectangular and in another embodiment elongated openings may be ovoid. In yet another embodiment, elongated openings 210 may be slits cut into expandable plug 210. Furthermore, although the shape of elongated openings 210 are described in the foregoing embodiments, they may be of any shape that allows the sides of expandable plug 200 to bow outward when compressed along central axis 215.

In one embodiment, expandable plug 200 is constructed from an elastomer material, such as, for example, rubber. In another embodiment expandable plug 200 is constructed of plastic or nylon. In yet another embodiment, expandable plug 200 is constructed from metal, such as spring steel, for example. In one embodiment, expandable plug 200 is constructed from a material that has sufficient memory to return to its relaxed state once tension is removed for ease in removal. Although specific materials are mentioned above, the material from which expandable plug 200 is constructed is not limited to the materials mentioned. Any material with properties appropriate for the functioning of expandable plug 200 may be used.

Figure 2B:
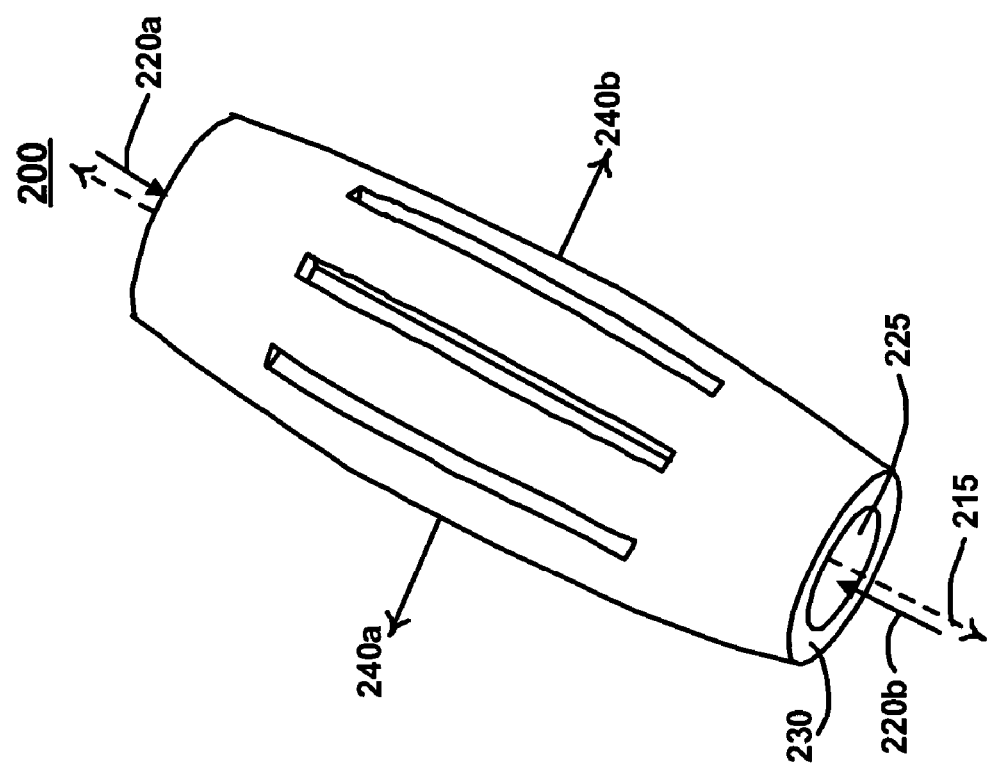
FIG. 2B is a diagram illustrating an expandable plug in a compressed state, according to an embodiment of the present invention.

FIG. 2B is a diagram illustrating expandable plug 200 in a compressed state, according to an embodiment of the present invention. Compression force (as depicted by arrows 220a and 220b) is shown to be applied at each end of expandable plug 200, compressing it along its central axis 215 and causing it to bow outward (as depicted by arrows 240a and 240b) and away from its central axis 215.

Figure 3:
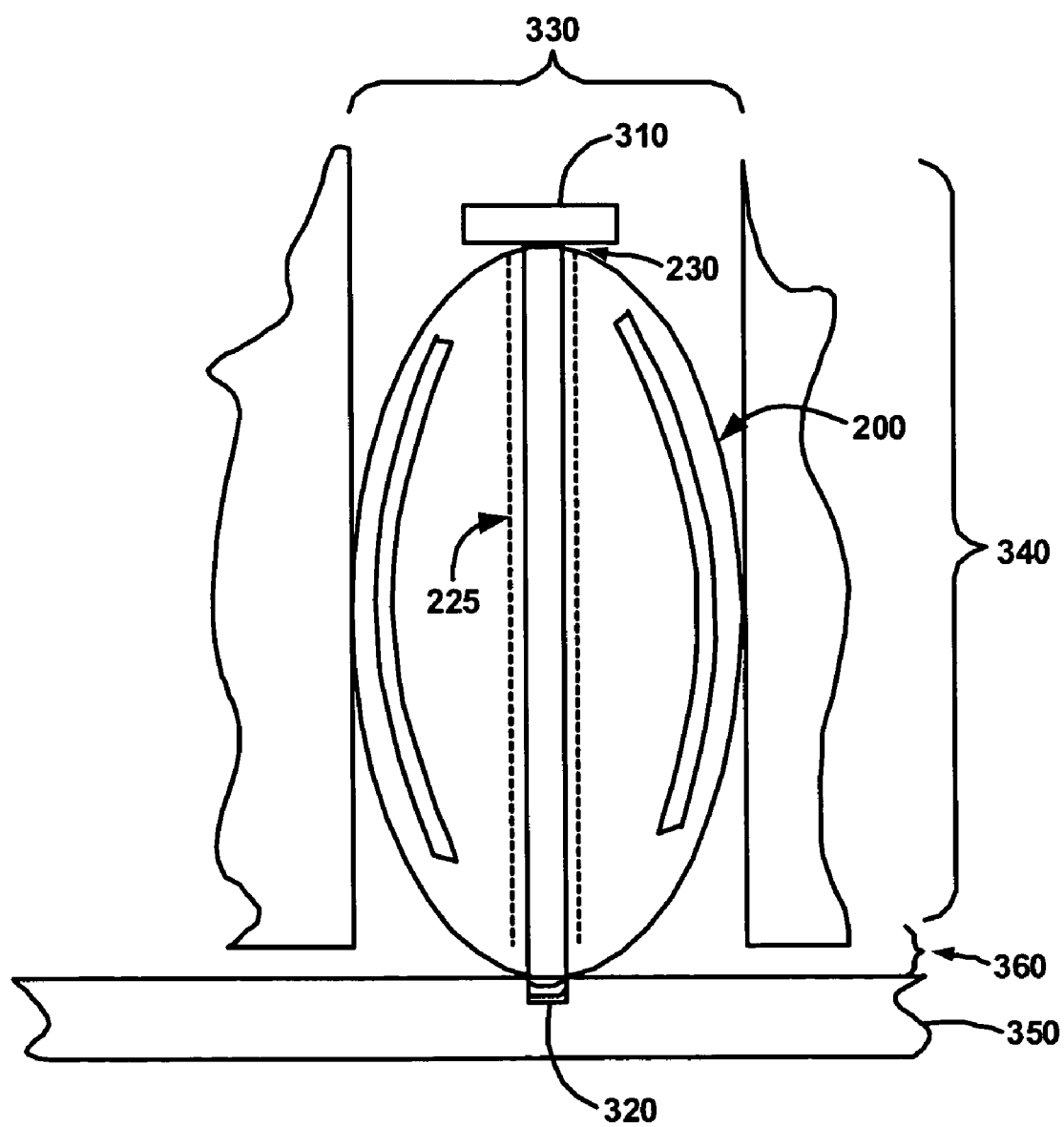
FIG. 3 illustrates a cross section of an expanded plug within a heatsink, according to an embodiment of the present invention.

Referring now to FIG. 3, a cross section of an expandable plug 200 is shown in a compressed state within a channel 330 of a cantilevered end 340 of a heatsink, according to an embodiment of the present invention. The present embodiment is well suited for use with multiple types of compressionors 310, shown here to be a screw. According to one embodiment, compressionor 310 is screwed into a supporting substrate e.g., PCB 350, at location 320 and tightened against the flat end 230 of compressionor-receiving component 225 and 230. For purposes of the present invention, the supporting substrate is referred to herein as PCB 350. However, it is appreciated that the supporting substrate may be any type of support structure on which a heatsink and a component to be cooled are mounted.

This tightening, or compression, causes expandable plug 200 to expand outward against the walls of channel 330 in cantilevered end 340 of a heatsink. The force exerted by expandable plug 200 against the walls of channel 330 secure the cantilevered end 340 at its natural elevation. Although compressionor 310 is described above as a screw, in another embodiment, compressionor 310 may be a cam. Compressionor 310 may be any type of device that may be received by compressionor-receiving component 225 and 230 and that functions to compress expandable plug 200 along its central axis to cause expandable plug 200 to expand or bow outward against the wall of channel 330.

Channel 330 may be comprised of a cylindrical, oval, square, or other shaped geometry. In one embodiment, wherein channel 330 conforms to a cylindrical geometry, the force applied to the walls of channel 330 can be substantial because, when expanded, expandable plug would contact a large area of the walls of channel 330. However, in any of the above geometries, the force applied to the walls by expandable plug 200 when compressed along its central axis (e.g., central axis 215 of FIG. 2A and 2B) can be sufficient to retain cantilevered end 340 of the heatsink at its natural elevation during vibration and shock experiences.

Channel opening 330 in the cantilevered end 340 of the heatsink can reside in the portion of the cantilevered end 340 that is in closest proximity to PCB 350. In another embodiment, a retention frame (e.g., retention frame 530 of FIG. 5) secures cantilevered end 340 to PCB 350. A gap 360 between PCB 350 and cantilevered end 340 may exist if the stackup thickness exceeds the allowance based on the height of the cantilevered end 340 of the heatsink, as discussed below (e.g., FIG. 5). In the present embodiment, expanded plug 200 secures the cantilevered end 340 of the heatsink at an elevation that allows gap 360 to be maintained while providing package integrity during shipping, handling, testing, operations, etc. By securing cantilevered end 340 while allowing gap 360 to be maintained, the force required to establish the electrical connection of a device being cooled and the thermal interface between the device being cooled and the heatsink is decoupled from the force required to maintain the electrical connection and the thermal interface during testing, shipping, etc, thus reducing the potential of damaging the device being cooled by subjecting it to excessive force.

Figure 4:
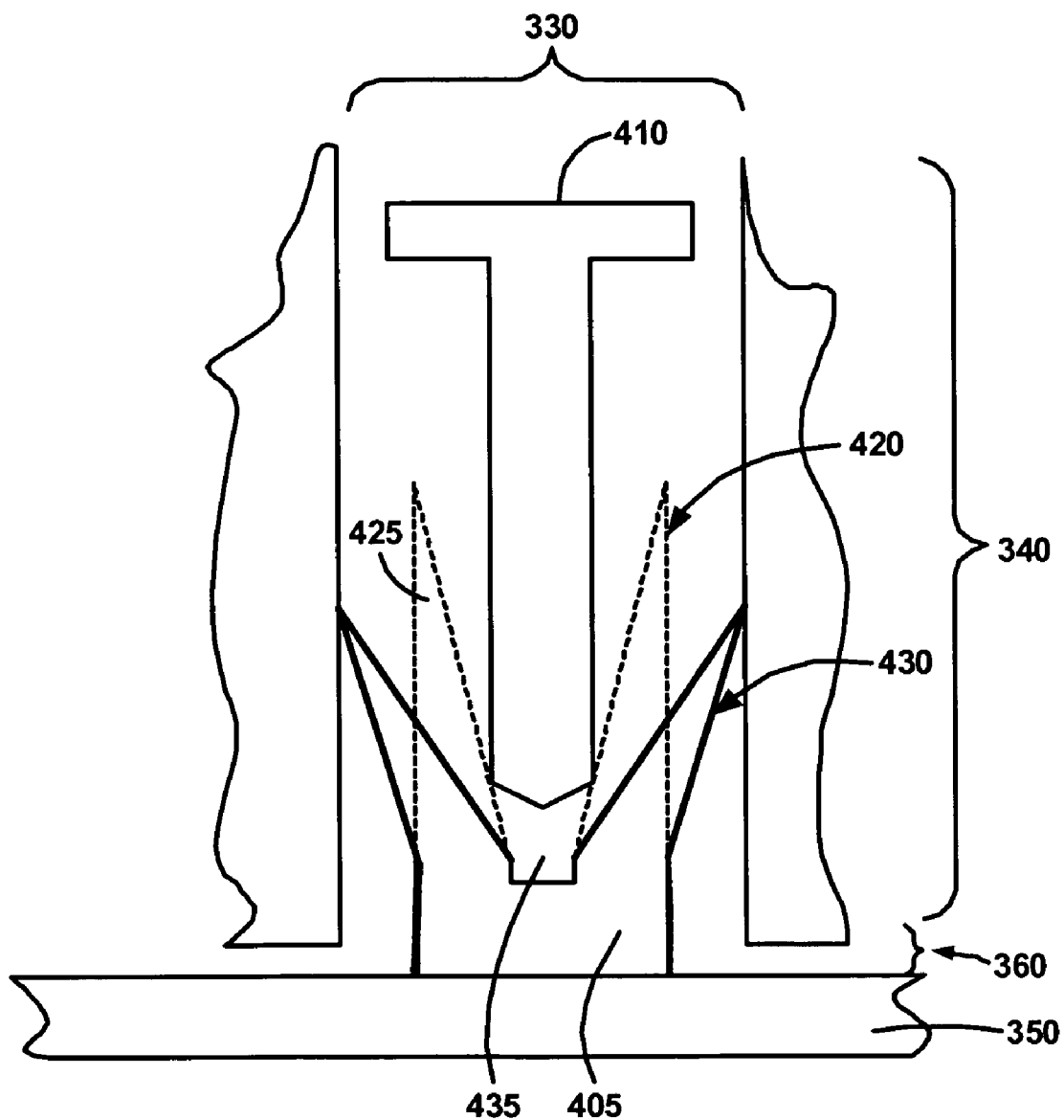
FIG. 4 depicts a cross section of an expandable standoff in both a relaxed and an expanded state within a heatsink, in accordance with one embodiment of the present invention.

Referring to FIG. 4, a cross section of an expandable standoff 405 is shown in both a relaxed state (depicted by dotted line 420) and an expanded state (depicted by solid line 430) within a channel 330 in a cantilevered end 340 of a heatsink, in accordance with one embodiment of the present invention. Expandable standoff 405 is coupled to a supporting substrate. For purposes of the present invention, the supporting substrate is referred to herein as PCB 350. However, it is appreciated that the supporting substrate may be any type of support structure on which a heatsink and a component to be cooled are mounted. In one embodiment, expandable standoff 405 is coupled directly to PCB 350 and in another embodiment expandable standoff 405 is coupled to a retention frame (e.g., retention frame 530 of FIG. 5) that is secured to PCB 350.

According to one embodiment, expandable standoff 405 is comprised of metal, such as spring steel, and is coupled to PCB 350 with a metal fastener, e.g., a screw, or with an adhesive or any other appropriate coupling medium or device. In another embodiment, metal expandable standoff 405 is coupled to PCB 350 by a weld. In one embodiment, expandable standoff 405 may be comprised of plastic or nylon and coupled to PCB 350 by a molding in PCB 350 (a molded PCB, for example) or by a screw, a fastener, or an adhesive or any medium appropriate for coupling a plastic or nylon device to a particular PCB material. Although specific materials are mentioned above, the material of which expandable standoff 405 is comprised is not limited to the materials mentioned, but may include any material with properties appropriate for the functioning of expandable standoff 405.

Still referring to FIG. 4, according to one embodiment, expandable standoff 405 has an opening 435, known herein as a compressionor-receiving component 435, in the center of angled arms, typically shown as 425. In one embodiment, there may be two angled arms 425, in another embodiment there may be three angled arms 425 and in yet another embodiment there may be four or more angled arms 425. Compressionor 410 works in concert with expandable standoff 405. When compressionor 410 moves downward into compressionor-receiving component 435 and between angled arms 425, angled arms 425 move outward and contact the walls of channel 330 and secure them at their natural elevation. Thus expandable standoff 405 is moved from its relaxed state 420 to its expanded state 430. Compressionor 410 can be a screw, according to one embodiment. In another embodiment it can be a cam. In other embodiments, compressionor 410 can be any device that can function with compressionor-receiving component 435 to expand angled arms 425 outward to contact and hold against walls of channel 330 in cantilevered end 340 of a heatsink.

Channel 330 resides, typically, in the portion of cantilevered end 340 that is in closest proximity to PCB 350 or, in another embodiment, to a retention frame secured to PCB 350. Gap 360 between PCB 350 and cantilevered end 340 may exist if a stackup thickness of components residing under cantilevered end 340 exceeds the allowance based on the height of the cantilevered end 340, as discussed below (e.g., FIG. 5). Expandable standoff 405, thus, secures the cantilevered end 340 at a natural elevation that allows gap 360, when it exists, to be maintained while providing package integrity during shipping, handling, testing, operations, etc. By securing cantilevered end 340 while allowing gap 360 to be maintained, the force required to establish the electrical connection of a device being cooled and the thermal interface between the device being cooled and the heatsink is decoupled from the force required to maintain the electrical connection and the thermal interface during testing, shipping, etc, thus reducing the potential of damaging the device being cooled by subjecting it to excessive force.

Figure 5:
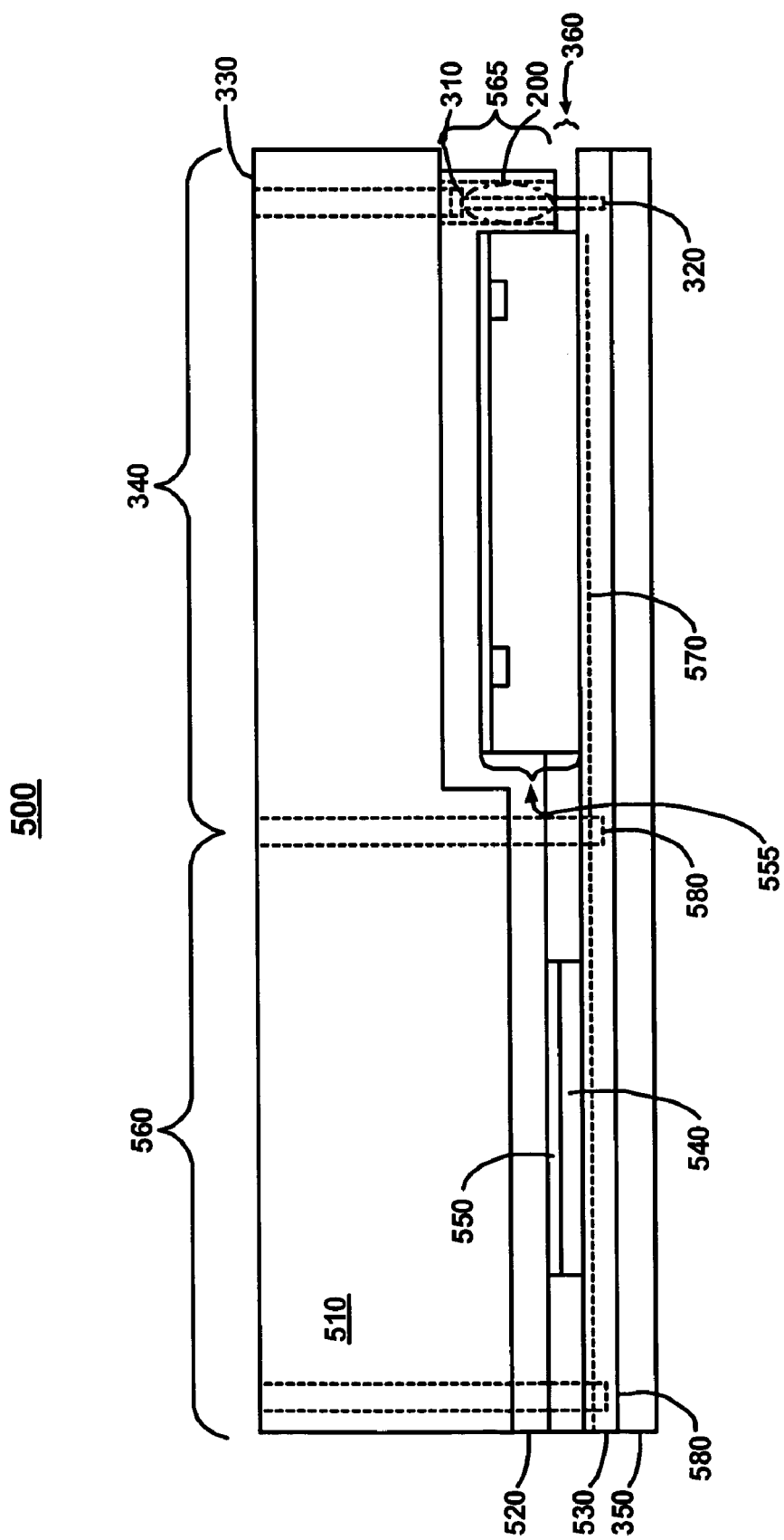
FIG. 5 depicts a heatsink mounted to a printed circuit board illustrating a cross section of an expandable plug deployed within the heatsink, according to an embodiment of the present invention.

FIG. 5 depicts a cantilevered heatsink 510 mounted to a PCB 350. FIG. 5 also depicts is a cross section of an expanded plug 200 deployed within a cantilevered end 340 of heatsink 510, according to an embodiment of the present invention. Heatsink 510, disposed in a heatsink frame 520, is mounted to the retention frame 530 of PCB 350 by mounting screws 580, according to one embodiment. Mounting screws 580 provide a force sufficient to maintain an electrical connection between component 540 (e.g., a processor) and PCB 350, e.g., via an electrical socket (not shown) located beneath component 540. Mounting screws 580 also provide a force sufficient to maintain a thermal interface between heatsink 510 and component 540 via a thermal interface component 550.

Still referring to FIG. 5, channel 330 in heatsink 510 resides, typically, in the portion of the cantilevered end 340 that is in closest proximity to PCB 350. In one embodiment, a gap 360 between PCB 350 and cantilevered end 340 may exist if a stackup thickness 555 of components residing under cantilevered end 340 exceeds the allowance based on the height 565 of the cantilevered end 340. In another embodiment, if stackup thickness 555 is less than the allowance based on height 565 of the cantilevered end 340, the portion of the cantilevered end 340 that is in closest proximity to PCB 350 may be flush with PCB 350. Generally, heatsink 510 is designed so that there is always a gap 360 between heatsink 510 and PCB 350 in order to ensure that all of the retention force is driven into holding processor 540 in place. When compressionor 310 is deployed with expandable plug 200 (operating as discussed above with FIG. 3), cantilevered end 340 is secured at a natural elevation that allows gap 360 to be maintained. Should gap 360 not exist, expandable plug 200 would maintain cantilevered end 340 at an elevation flush with PCB 530. In either case, expandable plug 200 provides package integrity during shipping, handling, testing, etc.

Figure 6:
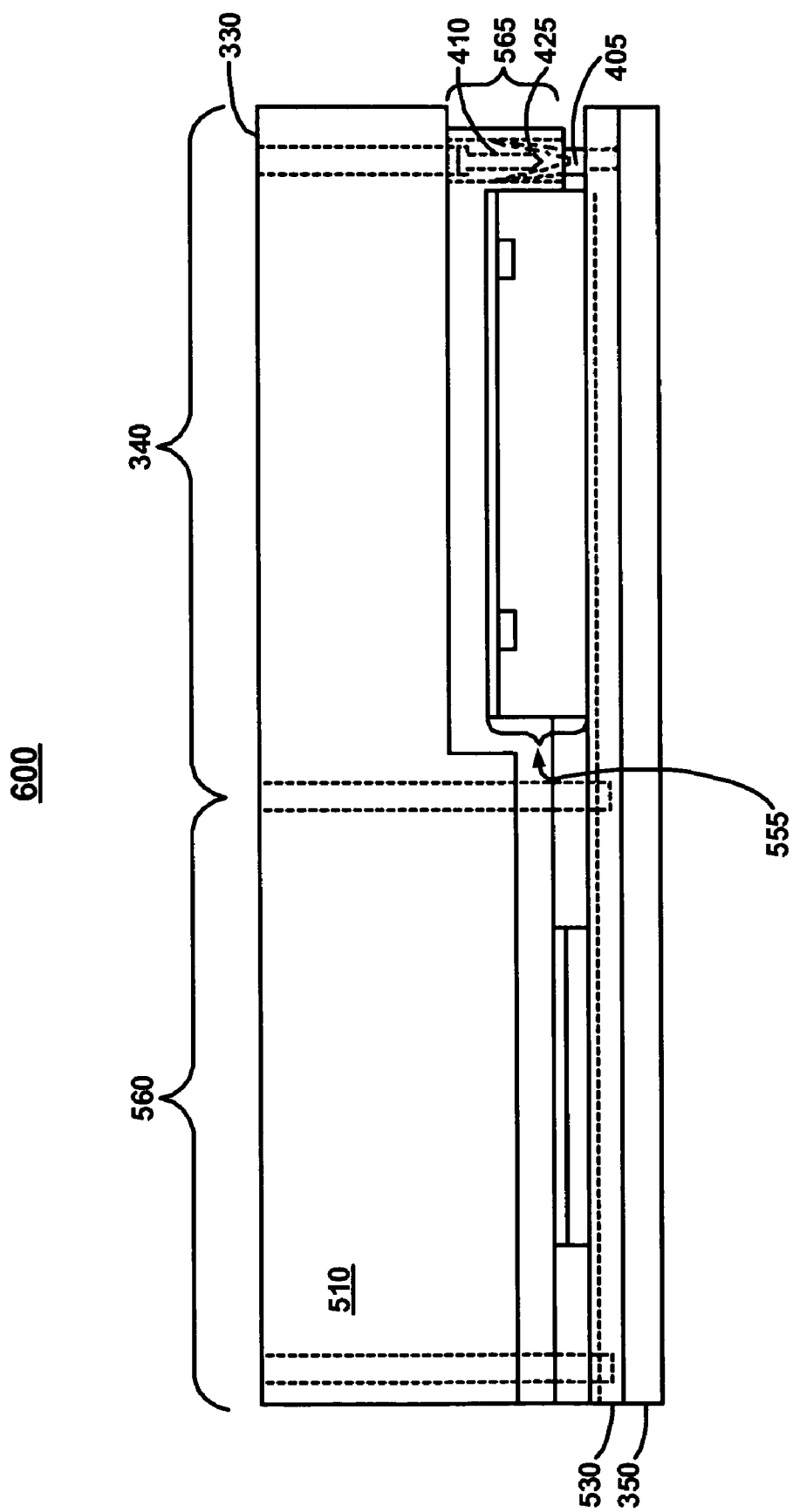
FIG. 6 depicts a heatsink mounted to a printed circuit board illustrating a cross section of an expandable standoff deployed within the heatsink, according to an embodiment of the present invention.

FIG. 6 depicts heatsink 510 of FIG. 5 mounted to printed circuit board 350 with an expandable standoff 405. A cross section of expandable standoff 405 deployed within the cantilevered end 340 of heatsink 510 is also depicted, according to an embodiment of the present invention.

A channel opening 330 in cantilevered heatsink 510 is in the portion of the cantilevered end 340 that is in closest proximity to PCB 350. In one embodiment, gap 360 between PCB 350 and heatsink 510 may exist if the stackup thickness 555 exceeds the allowance based on the height 565 of the cantilevered end 340 of heatsink 510, as discussed above (e.g., discussion of FIG. 5). Generally, heatsink 510 is designed so that there is always a gap 360 between heatsink 510 and PCB 350 in order to ensure that all of the retention force is driven into holding processor 540 in place. In another embodiment, if the stackup thickness 555 is less than the allowance based on the height 565 of cantilevered end 340, the portion of cantilevered end 340 that is in closest proximity to PCB 350 may be flush with PCB 350.

Still referring to FIG. 6, when compressionor 410 is deployed with expandable standoff 405, angled arms 425 expand (e.g., as described in FIG. 4 above) so that expandable standoff 405 secures cantilevered end 340 of heatsink 510 at an elevation that allows gap 360, to be maintained. If gap 360 does not exist, expandable standoff 405 maintains cantilevered end 340 at an elevation flush with PCB 530. In either case, expandable standoff 405 provides package integrity during shipping, handling, testing, etc.

FIG. 7 is a flowchart of a method 700 for enabling the securing of a cantilevered end 340 of a heatsink 510 at a given position relative to a component to be cooled 540, according to an embodiment of the present invention.

At step 710 of method 700, a compressionor-receiving component (e.g., compressionor-receiving component 225 and 230 of FIG. 3 or compressionor-receiving component 435 of FIG. 4) is provided.

At step 720 of method 700, an expandable section is provided that is coupled to the compressionor-receiving component and is configured to be disposed within an opening in a cantilevered end of a heatsink. When the expandable component is compressed into an expanded state, it secures the cantilevered end of the heatsink in a position relative to a component to be cooled. In one embodiment the expandable section may be, for example, the sides of expandable plug 200 of FIG. 3. In another embodiment, the expandable section may be the angled 425 of expandable standoff 400 of FIG. 4.

Embodiments of the present invention provide a force to prevent separation of the component upon which a heatsink resides from its established electrical connection and/or from the established thermal interface between the component and the heatsink during shipping, handling, shock testing, etc. Therefore, embodiments of the present invention decouple the need to provide thermal and socket interface load from the need to provide package integrity.

An embodiment of the present invention, an expandable bracing apparatus and method, is thus described. While the present invention has been described in various embodiments, the present invention should not be construed as limited by such embodiments, but rather construed according to the following claims and their equivalents.

What is claimed is:

1. An expandable bracing apparatus comprising:
   a compressionor-receiving component; and
   an expandable section coupled to said compressionor-receiving component, said expandable section structured to be disposed within an opening in a cantilevered end of a heatsink, wherein when compressed into an expanded state, said expandable section secures said cantilevered end at a position relative to a component to be cooled, and wherein said expandable section comprises a substantially cylindrical member having an opening along and through a central axis and having a plurality of elongated slits through the sides of said expandable section.

2. The expandable bracing apparatus of claim 1, wherein said expandable section is comprised of a material selected from a group consisting of:
   an elastomer material;
   nylon; and
   metal.

3. The expandable bracing apparatus of claim 1, wherein the expanded state is caused by a compressionor that is a screw.

4. The expandable bracing apparatus of claim 1, wherein the expanded state is caused by a compressionor that is a cam.

5. The expandable bracing apparatus of claim 1, further comprising:
   a coupling medium coupled to said expandable section, said coupling medium for assisting in securing said cantilever end at said position relative to said component to be cooled.

6. The expandable bracing apparatus of claim 5 wherein said expandable section comprises a plurality of angled arms.

7. The expandable bracing apparatus of claim 6, further comprising a material selected from the group consisting of:
   spring steel;
   plastic; and
   nylon.

8. The expandable bracing apparatus of claim 6, wherein said coupling medium is selected from a group comprising of:
   a weld;
   a metal fastener;
   an adhesive; and
   a molding molded into a supporting substrate.

9. An expandable anchor for securing a heatsink comprising:
   a compressionor-receiving component; and
   an expandable section coupled to said compressionor-receiving component, said expandable section structured to be disposed within an opening in a cantilevered end of said heatsink, wherein when compressed into an expanded state, said expandable section secures said cantilevered end at a position relative to a component to be cooled and wherein said expandable section comprises a cylindrical plug having a substantially cylindrical opening through a central axis and having a plurality of elongated openings cut through the walls of said expandable section.

10. The expandable anchor of claim 9, wherein said expandable anchor comprises an elastomer material.

11. The expandable anchor of claim 9, wherein the expanded state is caused by a compressionor that is a screw.

12. The expandable anchor of claim 9, further comprising:

a coupling medium coupled to said expandable section, said coupling medium for assisting in securing said cantilevered end at said position relative to said component to be cooled.

13. The expandable anchor of claim 12 wherein said expandable section comprises a plurality of angled arms.

14. The expandable anchor of claim 13, wherein said plurality of angled arms comprises three angled arms.

15. The expandable anchor of claim 14, wherein said coupling medium is selected from a group comprising essentially of:
   a weld;
   a metal fastener;
   an adhesive; and
   a molding molded into said printed circuit board.

16. The expandable anchor of claim 13, further comprising a material selected from the group consisting essentially of:
   spring steel; and
   nylon.

17. A method for enabling the securing of a cantilevered end of a heatsink at a position relative to a component to be cooled, said method comprising:

providing a compressionor-receiving component; and
providing an expandable section coupled to said compressionor-receiving component, said expandable section structured to be disposed within an opening in a cantilevered end of said heatsink, wherein when compressed into an expanded state, said expandable section secures said cantilevered end at said position relative to said component to be cooled and wherein said expandable section comprises a cylindrical plug having a substantially cylindrical opening through a central axis and having a plurality of elongated openings cut through the walls of said expandable section.

18. The method as recited in claim 17, wherein said position relates to the thickness of a device to be cooled and a thermal interface shared by said heatsink and said device.

19. The method as recited in claim 17, wherein said expandable brace comprises an expandable plug.

20. The method as recited in claim 19, wherein the expanded state is caused by a compressionor that is a screw.

21. The method as recited in claim 17, wherein said expandable brace comprises an expandable standoff.

* * * * *

UNITED STATES PATENT AND TRADEMARK OFFICE
CERTIFICATE OF CORRECTION

| | |
|---|---|
| PATENT NO. | : 7,277,292 B2 |
| APPLICATION NO. | : 10/834517 |
| DATED | : October 2, 2007 |
| INVENTOR(S) | : Stephan Karl Barsun et al. |

Page 1 of 1

It is certified that error appears in the above-identified patent and that said Letters Patent is hereby corrected as shown below:

In column 9, line 11, in Claim 15, delete "essentially" before "of:".

In column 9, line 17, in Claim 16, after "consisting" delete "essentially".

Signed and Sealed this

Seventeenth Day of June, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,277,292 B2 | |
| APPLICATION NO. | : 10/834517 | |
| DATED | : October 2, 2007 | |
| INVENTOR(S) | : Stephan Karl Barsun et al. | |

It is certified that error appears in the above-identified patent and that said Letters Patent is hereby corrected as shown below:

In column 9, line 11, in Claim 15, delete "essentially" before "of:".

In column 9, line 17, in Claim 16, after "consisting" delete "essentially".

Signed and Sealed this

First Day of July, 2008

JON W. DUDAS
*Director of the United States Patent and Trademark Office*